(12) United States Patent
Zelinski et al.

(10) Patent No.: US 8,148,985 B2
(45) Date of Patent: Apr. 3, 2012

(54) METHOD FOR REDUCING MAXIMUM LOCAL SPECIFIC ABSORPTION RATE IN MAGNETIC RESONANCE IMAGING

(75) Inventors: Adam C Zelinski, Watertown, MA (US); Kawin Setsompop, Cambridge, MA (US); Elfar Adalsteinsson, Belmont, MA (US); Vivek Goyal, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 356 days.

(21) Appl. No.: 12/580,076

(22) Filed: Oct. 15, 2009

(65) Prior Publication Data

US 2010/0134105 A1 Jun. 3, 2010

Related U.S. Application Data (60) Provisional application No. 61/105,459, filed on Oct. 15, 2008.

(51) Int. Cl.
*G01V 3/00* (2006.01)
(52) U.S. Cl. ........................................ 324/309; 324/318
(58) Field of Classification Search .......... 324/300–322; 600/407–445
See application file for complete search history.

(56) References Cited

U.S. PATENT DOCUMENTS

| | | | | |
|---|---|---|---|---|
| 6,989,673 | B2 * | 1/2006 | Zhu | 324/318 |
| 7,053,618 | B2 * | 5/2006 | Zhu | 324/318 |
| 7,075,301 | B2 * | 7/2006 | Zhu | 324/318 |
| 7,075,302 | B2 * | 7/2006 | Zhu | 324/318 |
| 7,385,396 | B2 * | 6/2008 | Zhu | 324/309 |

OTHER PUBLICATIONS

K. Setsompop, et al., "Parallel RF Transmission with Eight Channels at 3 Tesla," Magnetic Resonance in Medicine; 2006, 56:1163-1171.
U. Katscher, et al., "Transmit Sense," Magnetic Resonance in Medicine; 2003, 49:144-150.
Y. Zhu in "Parallel Excitation with an Array of Transmit Coils," Magnetic Resonance in Medicine; 2004, 51:775-784.
W. Grissom, et al., "Spatial Domain Method for the Design of RF Pulses in Multicoil Parallel Excitation," Magnetic Resonance in Medicine; 2006, 56:620-629.
M. Griswold, et al., "Autocalibrated Accelerated Parallel Excitation (Transmit-GRAPPA)," Proceedings of the 13th Annual Meeting of ISMRM; 2005, 2435.

(Continued)

*Primary Examiner* — Brij Shrivastav
(74) *Attorney, Agent, or Firm* — Quarles & Brady LLP (57) ABSTRACT

A method for reducing maximum local specific absorption rate ("SAR") in a magnetic resonance imaging ("MRI") system is disclosed. More specifically, a plurality of candidate radio frequency ("RF") pulses are designed and the manner in which they are applied to a subject is determined such that the maximum local SAR is substantially reduced relative to applying the candidate RF pulse that produces the lowest maximum local SAR alone. Put another way, this "time-multiplexing" of a set of RF pulses that each produce approximately the same excitation pattern yields a lower maximum local SAR than does transmitting the individual RF pulse having the lowest local SAR over many repetition times ("TRs"). A convex optimization method is utilized to determine the manner in which the RF pulses are multiplexed in time such that a substantially lower maximum local SAR is achieved.

17 Claims, 5 Drawing Sheets

OTHER PUBLICATIONS

P. Ullmann, et al., "Experimental Analysis of Parallel Excitation Using Dedicated Coil Setups and Simultaneous RF Transmission on Multiple Channels," Magnetic Resonance in Medicine; 2005, 54:994-1001.

D. Xu, et al., "A Noniterative Method to Design Large-Tip-Angle Multidimensional Spatially-Selective Radio Frequency Pulses for Parallel Transmission," Magnetic Resonance in Medicine; 2007, 58:326-334.

P. Vernickel, et al., "Eight-Channel Transmit/Receive Body MRI Coil at 3T," Magnetic Resonance in Medicine; 2007, 58:381-389.

U. Katscher and P. Bornert "Parallel RF Transmission in MRI." NMR Biomed, 19:393-400 (2006).

F. Seifert et al., "Patient Safety Concept for Multichannel Transmit Coils," J Magn Reson Imag, 26:1315-1321 (2007).

I. Graesslin, et al., in "A Minimum SAR RF Pulse Design Approach for Parallel Tx with Local Hot Spot Suppression and Exact Fidelity Constraint," Proc. Intl. Soc. Magn. Reson. Med., 2008; 621.

* cited by examiner

METHOD FOR REDUCING MAXIMUM LOCAL SPECIFIC ABSORPTION RATE IN MAGNETIC RESONANCE IMAGING

CROSS-REFERENCE TO RELATED APPLICATIONS

This application claims the benefit of U.S. Provisional patent application Ser. No. 61/105,459 filed on Oct. 15, 2008, and entitled "Method for Reducing Local Specific Absorption Rate in Magnetic Resonance Imaging."

STATEMENT REGARDING FEDERALLY SPONSORED RESEARCH

This invention was made with government support under grant numbers R01 EB007942 and EB006847 awarded by the National Institues of Health. The government has certain rights in this invention.

BACKGROUND OF THE INVENTION

The field of the invention is magnetic resonance imaging ("MRI") systems and methods. More particularly, the invention relates to reducing specific absorption rate ("SAR") in a subject imaged with an MRI system.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct an image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear", or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

Most MRI scanners use a single-channel RF excitation coil to tip the spin magnetization away from its equilibrium state and initiate a measurement cycle. Usually, a radio frequency ("RF") excitation pulse is used to excite either all of the spins inside the excitation coil (non-selective excitation), a single slice through the subject (slice-selective excitation), or within only a specific region, such as, a small cube (3-D spatially-selective excitation). In spatially-selective, spatially-tailored excitation, the RF pulse is played out in the presence of gradient waveforms that impart a time-varying gradient onto the main magnetic field of the MRI system, which is instrumental in the spatial and selective excitation process. In general, the gradient field may be viewed as causing the traversal of a curve in excitation k-space, a path that may proceed through all three dimensions of k-space ($k_x$, $k_y$, and $k_z$), which under certain assumptions is essentially a 3-D Fourier domain. During this traversal of excitation k-space, the energy of the RF pulse being played in conjunction with the gradient waveforms may be viewed as depositing RF energy along this k-space excitation trajectory curve. The RF pulse thus produces an excitation that modulates (in phase, in amplitude, or both) as a function of position ($k_x$, $k_y$, and $k_z$) in excitation k-space. The resulting excitation is often closely related to the inverse Fourier transform of this deposited energy.

For example, in a typical slice-selective RF pulse, a constant gradient field is applied in the z-direction while an RF pulse shaped like a sine cardinal ("sinc") function is transmitted through the MRI system's single excitation coil. In this instance, the gradient field causes the RF pulse energy to be deposited along a single line (a "spoke") in the $k_z$-direction of excitation k-space, that is, a line through the k-space position $(0,0,k_z)$. This sinc-like deposition in $k_z$ excites only those magnetic spins within a thin slice of tissue due to the Fourier relationship between energy deposited in excitation k-space and the flip angle of the resulting magnetization. In short, the magnetization that results from this typical RF pulse is a constant degree of excitation within the slice and no excitation out of the slice.

Recent work has extended this slice-selective concept to all three spatial dimensions, in which not only a thin slice is excited, but a particular pattern within the slice itself is excited. These "spatially-tailored" excitations in 2D and 3D require lengthy application of the RF excitation and associated gradients. A recent method, termed "parallel transmission" (and sometimes referred to as "parallel excitation"), exploits variations among the different spatial profiles of a multi-element RF coil array. This permits sub-sampling of the gradient trajectory needed to achieve the spatially-tailored excitation and this method has been shown in many cases to dramatically speed up, or shorten, the corresponding RF pulse.

This "acceleration" of the spatially-tailored RF excitation process makes the pulse short enough in duration to be clinically useful. Accelerations of 4 to 6 fold have been achieved via an 8 channel transmit system as disclosed by K. Setsompop, et al., in "Parallel RF Transmission with Eight Channels at 3 Tesla," *Magnetic Resonance in Medicine;* 2006, 56:1163-1171. This acceleration enables several important applications, including flexibly shaped excitation volumes and mitigation of RF field inhomogeneity at high field for slice or slab-selective pulses. A number of methods have been proposed for the design of the RF and gradient waveforms for parallel excitation, such as those disclosed, for example, by U. Katscher, et al., in "Transmit SENSE," *Magnetic Resonance in Medicine;* 2003, 49:144-150; by Y. Zhu in "Parallel Excitation with an Array of Transmit Coils," *Magnetic Resonance in Medicine;* 2004, 51:775-784; by M. Griswold, et al., in "Autocalibrated Accelerated Parallel Excitation (Transmit-GRAPPA)," *Proceedings of the 13th Annual Meeting of ISMRM;* 2005, 2435; and by W. Grissom, et al., in "Spatial Domain Method for the Design of RF Pulses in Multicoil Parallel Excitation," *Magnetic Resonance in Medicine;* 2006, 56:620-629.

Successful implementations have been demonstrated on multi-channel hardware, including those described by P. Ullmann, et al., in "Experimental Analysis of Parallel Excitation Using Dedicated Coil Setups and Simultaneous RF Transmission on Multiple Channels," *Magnetic Resonance in Medicine;* 2005, 54:994-1001; by D. Xu, et al., in "A Noniterative Method to Design Large-Tip-Angle Multidimensional Spatially-Selective Radio Frequency Pulses for Parallel Transmission," *Magnetic Resonance in Medicine;* 2007, 58:326-334; and by P. Vernickel, et al., in "Eight-Channel Transmit/Receive Body MRI Coil at 3T," *Magnetic Resonance in Medicine;* 2007, 58:381-389.

Spatially-tailored excitations using parallel transmission methods are designed to provide a prescribed excitation pattern at the Larmor frequency of a specific spin species. As such, the parallel transmission of RF excitation pulses in the presence of two-dimensional (2D) and three-dimensional (3D) gradient trajectories offers a flexible means for volume excitation and the mitigation of main magnetic field, $B_0$, and $B_1^+$ inhomogeneity. Parallel transmission systems are adept at these tasks because their RF excitation arrays include multiple independent transmission elements with unique spatial profiles that may be modulated and superimposed to tailor the magnitude and phase of the transverse magnetization across a chosen field-of-excitation (FOX). Parallel transmission systems are also promising because they enable one to reduce the duration of an RF pulse even after one has exhausted the ability to do so by increasing the amplitude and slew rates of the system's gradient coils. Namely, one may significantly undersample the excitation k-space trajectory (reducing the distance traveled in k-space), in turn shortening the corresponding RF pulse. The ability to "accelerate" in the k-space domain arises due to the extra degrees of freedom provided by the system's multiple transmit elements. Unfortunately, as described, for example, by U. Katscher and P. Bornert in "Parallel RF Transmission in MRI." *NMR Biomed,* 19:393-400 (2006), using parallel transmission to accelerate a k-space trajectory increases peak pulse power, creating an additional specific absorption rate ("SAR") concern beyond the aforementioned hot spot problem.

SAR, which is defined as the average energy deposition in an N-gram region over an extended period of time due to the application of one or more RF excitation pulses in units of watts per kilogram ("W/kg"), is a concern when conducting MRI experiments on human subjects, especially during the parallel transmission of spatially-tailored multi-dimensional excitation pulses through a multi-channel transmission system. This is because when multiple transmit channels are simultaneously employed, the local electric fields generated by each channel undergo local superposition and local extremes in electric field magnitude may arise, leading to spikes in local SAR that are of concern to regulatory bodies in both the United States and Europe. For a discussion of these regulatory concerns in the United States, see, for example, Center for Devices and Radiologic Health "Guidance for the Submission of Premarket Notifications for Magnetic Resonance Diagnostic Devices," *Rockville, Md.: Food and Drug Administration;* 1998, and in Europe, see, for example, International Electrotechnical Commission, "International Standard, Medical Equipment-Part 2: Particular Requirements for the Safety of Magnetic Resonance Equipment for Medical Diagnosis, 2nd Revision," *Geneva: International Electrotechnical Commission;* 2002. Recent studies have confirmed the consistent presence of "hot spots" and found that parallel transmitted pulses produce relatively-high ratios of local to whole-head average SAR, as is described by, for example, F. Seifert et al., in "Patient Safety Concept for Multichannel Transmit Coils," *J Magn Reson Imag,* 26:1315-1321 (2007). These relatively-high ratios of local to whole-head average SAR make local SAR the limiting factor of parallel transmission MRI.

Recently, two methods have been proposed that attempt to address and mitigate parallel transmission SAR concerns by improving upon how parallel transmission pulses are designed. The first such method places $l_2$ and $l_\infty$ constraints during the design of the RF waveform. Because the majority of pulse design methods generate a pulse by solving a linear system of equations, a simple way to indirectly reduce SAR is to impose regularizations while solving the linear system, constraining or reducing the root-mean-square or peak amperages of the resulting parallel transmission pulses. This approach requires no knowledge of the local electric field generated by each transmit array element, but it does not guarantee a SAR decrease because parallel transmission SAR does not scale directly as a function of the $l_2$ and $l_\infty$ energies of a multi-channel RF pulse.

The second such SAR reduction method involves placing constraints on global and local SAR. In this method, SAR constraints are explicitly built into the pulse design process. Because both whole-head mean SAR and local N-gram SAR at any location may be expressed quadratically in terms of pulse sample values, constraints on both whole-head and local SAR may be incorporated simply by adding quadratic constraints to the design method. For example, the method described by I. Graesslin, et al., in "A Minimum SAR RF Pulse Design Approach for Parallel Tx with Local Hot Spot Suppression and Exact Fidelity Constraint," *Proc. Intl. Soc. Magn. Reson. Med.,* 2008; 612, explicitly accounts for global SAR as well as local SAR at several spatial locations by incorporating several quadratic constraints into the design. One limitation that seems unavoidable, however, is that in order to design truly SAR-optimal pulses, that is, ones where local SAR is guaranteed at all spatial locations in a given model, one is faced with the computationally-intractable problem of solving a system of equations with tens of thousands (millions) of quadratic constraints for moderate (high) resolution models.

The pulse design techniques discussed above focus on designing a single pulse with favorable SAR characteristics. This same pulse is then transmitted over many repetition time ("TR") periods to accomplish the imaging task for which it is specifically designed. Thus, these SAR reduction methods are limited in that they spend all of their computation effort at designing only one parallel transmission RF pulse set that is then transmitted many times. Moreover, they assume that the best method for minimizing the maximum local SAR within a particular region of interest in a subject is to design one multi-channel pulse that has a minimum local SAR profile.

It would therefore be desirable to provide a computationally-efficient method for significantly reducing the local SAR within a localized spatial volume-of-interest in a subject using a plurality of different RF excitation pulses.

SUMMARY OF THE INVENTION

The present invention overcome the drawbacks of previous methods for minimizing specific absorption rate ("SAR") by providing a computationally-efficient method for determining a timing schedule, termed "time multiplexing," for the application of a plurality of candidate radio frequency ("RF") excitation pulses, each of which have very similar excitation profiles, but different SAR profiles, such that the maximum local SAR in a spatial volume-of-interest is substantially optimally minimized. More particularly, the maximum local SAR is significantly reduced relative to the maximum local SAR that would arise if only the best single pulse (in the minimum maximum local SAR sense) were used to produce the desired excitation. To achieve this effect, the determined timing schedule defines not only a subset of the candidate RF pulses that are to be employed, but also the relative temporal weighting with which to apply each pulse during a given number of repetition time ("TR") periods. The method of the present invention, and specifically the concept of time multiplexing, applies not only to slice-selective parallel transmission pulses, but also to conventional single-channel systems and any type of pulse.

It is an aspect of the present invention to provide a method for determining a timing schedule for the application of one or more RF excitation pulses from a set of candidate pulses, such that when the selected pulses are played according to the timing schedule, the maximum local SAR produced in a region of interest is substantially minimized. To begin, finite difference time domain ("FDTD") simulations are conducted, for example, on a realistic body tissue model to obtain magnetic and electric field maps of a particular parallel transmit coil array (one magnetic and electric field map per transmission channel). The resulting magnetic field maps are utilized to produce RF transmission, or $B_1^+$, maps, which are, in turn, utilized to generate a plurality of candidate RF excitation pulses. For example, a magnitude least squares ("MLS") pulse design method is employed to design two-spoke RF excitation pulses. SAR calculations are conducted using the electric field data to determine the local N-gram SAR arising at each spatial location due to the application of each RF excitation pulse.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
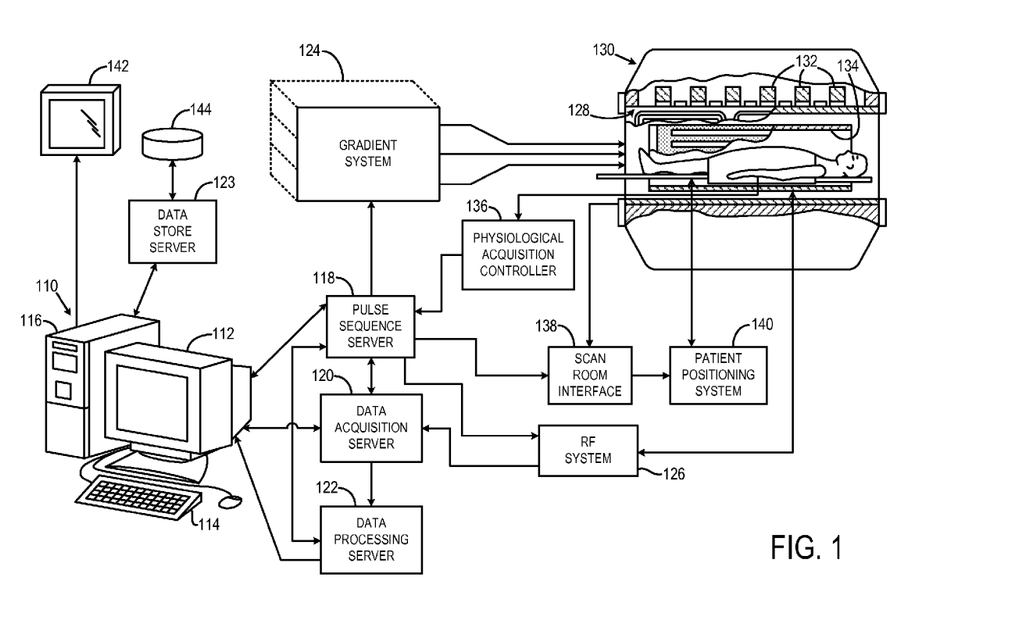
FIG. 1 is a block diagram of a magnetic resonance imaging ("MRI") system that employs the present invention.

Referring particularly to FIG. 1, the preferred embodiment of the invention is employed in a magnetic resonance imaging ("MRI") system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and a radio frequency ("RF") system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \qquad \text{Eqn. (1);}$$

and the phase of the received MR signal may also be determined:

$$\phi = \tan^{-1}\left(\frac{Q}{I}\right). \qquad \text{Eqn. (2)}$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography (MRA) scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Figure 2:
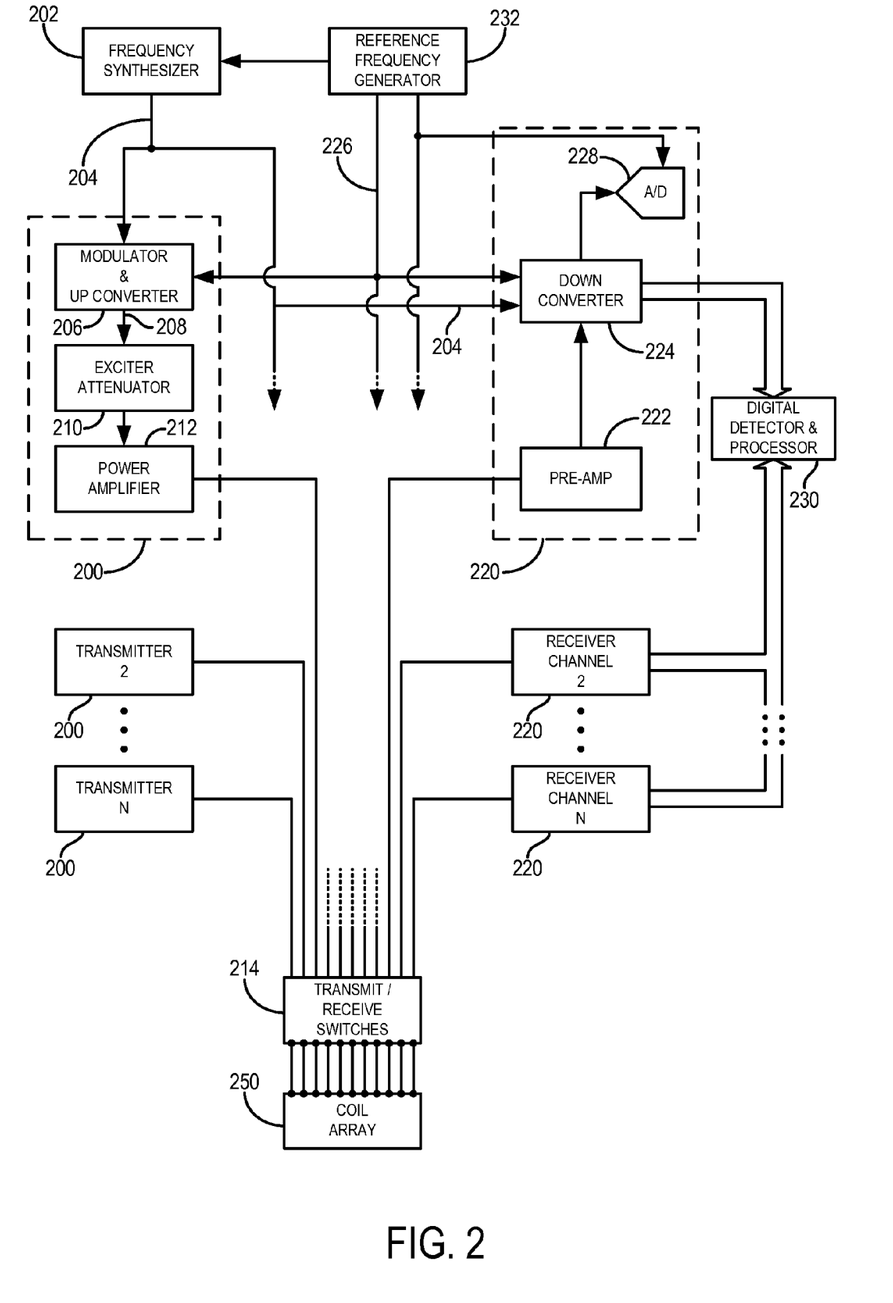
FIG. 2 is a block diagram of a radio frequency ("RF") system that forms part of the MRI system of FIG. 1.

Referring now to FIG. 2, the present invention employs a coil array 250 that includes a plurality of coil elements that can be separately driven by a plurality of RF transmitters to produce the prescribed RF field-of-excitation ("FOX"). The same coil array 250 can also be used with a plurality of receive channels, or in the alternative, the whole body RF coil 134 or a local RF coil can be used to acquire the MR signals. Many different coil array structures 250 may be used with the present invention, which, in part, maps the $B_1^+$ RF excitation field produced by each coil array element.

Referring particularly to FIG. 2, the RF system 126 includes a set of transmitters 200 that each produce a prescribed RF excitation field. The base, or carrier, frequency of this RF excitation field is produced under control of a frequency synthesizer 202 which receives a set of digital signals from the pulse sequence server 118. These digital signals indicate the frequency and phase of the RF carrier signal produced at an output 204. The RF carrier is applied to a modulator and up converter 206 in each transmitter 200 where its amplitude is modulated in response to a signal also received from the pulse sequence server 118. The signal defines the envelope of the RF excitation pulse to be produced and is produced by sequentially reading out a series of stored digital values. These stored digital values may be changed to enable any desired RF pulse envelope to be produced by each transmitter 200.

The magnitude of the RF excitation pulse produced at output 208 is attenuated by an exciter attenuator circuit 210 in each transmitter 200, which receives a digital command from the pulse sequence server 118. The attenuated RF excitation pulses are applied to a power amplifier 212 in each transmitter 200. The power amplifiers are current source devices that connect to respective transmit inputs on a set of transmit/receive switches 214. By way of example, N transmitters 200 are employed and connected through N transmit/receive switches 214 to N coil elements in an RF coil array 200.

Referring still to FIG. 2 the signal produced by the subject is picked up by the coil array 200 and applied to the inputs of a set of receive channels 220. A pre-amplifier 222 in each receiver channel 220 amplifies the signal by an amount determined by a digital attenuation signal received from the pulse sequence server 118. The received signal is at or around the Larmor frequency, and this high frequency signal is down converted in a two step process by a down converter 224, which first mixes the NMR signal with the carrier signal on line 204 and then mixes the resulting difference signal with a reference signal on line 226. The down converter NMR signal is applied to the input of an analog-to-digital ("A/D") converter 228 which samples and digitizes the analog signal and applies it to a digital detector and signal processor 230, which produces 16-bit in-phase ("I") values and 16-bit quadrature ("Q") values corresponding to the received signal. The resulting stream of digitized I and Q values of the received signal are output to the data acquisition server 120. The reference signal as well as the sampling signal applied to the A/D converter 228 are produced by a reference frequency generator 232.

The transmit/receive switches 214 are operated by the pulse sequence server 118 to connect the N transmitters 200 to the N coil elements in the coil array 250 during those parts of the pulse sequence in which an RF field is to be produced. Each transmitter 200 is separately controlled by the pulse sequence server 118 to produce an RF field of a prescribed amplitude, frequency, phase and envelope at each of the N coil elements. The combined RF fields of the N coil elements produce the prescribed $B_1$ field throughout the region of interest in the subject during the imaging phase of the procedure.

When the $B_1$ field is not produced the pulse sequence server 118 operates the transmit/receive switches 214 to connect each of the N receive channels to the respective N coil elements. Signals produced by excited spins in the subject are picked up and separately processed as described above.

Figure 3:
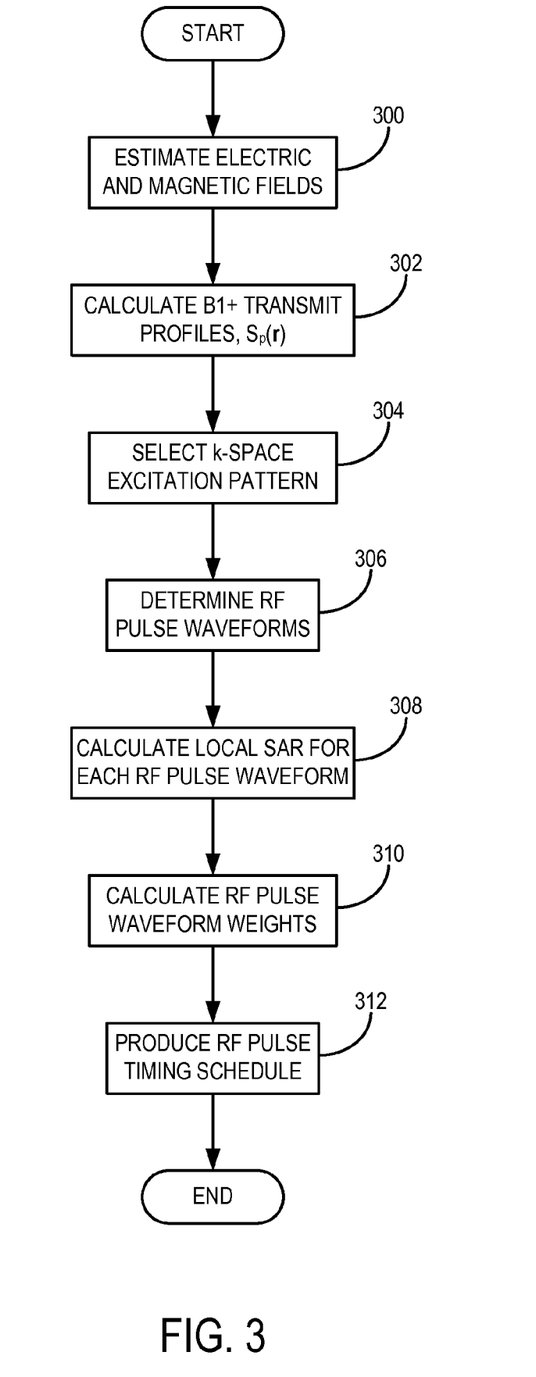
FIG. 3 is a flowchart setting forth the steps of an exemplary method for determining a plurality of RF pulse waveforms and the associated timings at which they are applied in order to minimize the local specific absorption rate at a desired location in a subject.

Referring particularly to FIG. 3, a flowchart setting forth the steps of an exemplary method for determining a timing schedule for the application of a plurality of RF pulses is illustrated. In particular, the determined timing schedule is designed such that a substantially suppressed local specific absorption rate ("SAR") is exhibited in a selected portion of a subject. In order to design a plurality of candidate parallel transmission RF excitation pulses and calculate their respective spatial SAR distributions, the electric and magnetic fields produced in a selected FOX by each individual transmit channel are first estimated, as indicated at step 300. For example, the electric field, E, is estimated at each point in the FOX using a finite difference time domain ("FDTD") simulation such as, for example, a 300 megahertz ("MHz") FDTD simulation using the commercially available XFDTD software package. XFDTD is a registered trademark of REMCOM Inc., State College, Pa. By way of example, the FDTD simulation is performed on a tissue phantom that approximates the relevant physical characteristics of the portion of the subject that it is desired to image. For example, a head tissue phantom is employed when it is desired to reduce the maximum local SAR in a subject's head during neurological imaging procedures. In general, the frequency of the FDTD simulation scales with the magnetic field strength of the main magnetic field, $B_0$, of the MRI system.

In order to reduce the computational burden of this process, the electric field is estimated for only a select number of excitations. Modulated versions of these electric fields are then superimposed to produce an estimate for a given excitation. For example, given an eight-channel parallel transmission array, the $p^{th}$ transmit channel is driven with a 1 ampere peak-to-peak 300 MHz sinusoid while the other channels remain dormant. The FDTD method is then employed to obtain the steady-state electric field per ampere of input to the $p^{th}$ channel, which have the form:

$$E_p(r) = [E_{p,x}(r), E_{p,y}(r), E_{p,z}(r)]^T \quad \text{Eqn. (3)};$$

and the corresponding magnetic fields per ampere of input to the $p^{th}$ channel, which have the form:

$$B_p(r) = [B_{p,x}(r), B_{p,y}(r), B_{p,z}(r)]^T \quad \text{Eqn. (4)}.$$

These fields are estimated at each spatial location $r=[x,y,z]^T$ in the FOX. The use of current sources provides a means to accurately approximate the simultaneous-drive behavior of the parallel transmit array by superimposing the field maps of individual channels in the array.

Next, the RF transmission field, $B_1^+$, generated by the $p^{th}$ channel in the coil array, $S_p(r)$, is determined, as indicated at step 302. For example, when driven by a unit ampere input, $S_p(r)$ is determined at each spatial location, r, as follows:

$$S_p(r) = \frac{1}{2}[B_{p,x}(r) + iB_{p,y}(r)]; \quad \text{Eqn. (5)}$$

where $B_{p,x}(r)$ and $B_{p,y}(r)$ are the x- and y-components of the magnetic field estimated in step 300. Subsequently, an efficient manner in which these transmit profiles, $S_p(r)$, are modulated in both magnitude and phase such that their combination over time yields a substantially uniform excitation within a thin slice in the subject is determined.

Figure 4A:
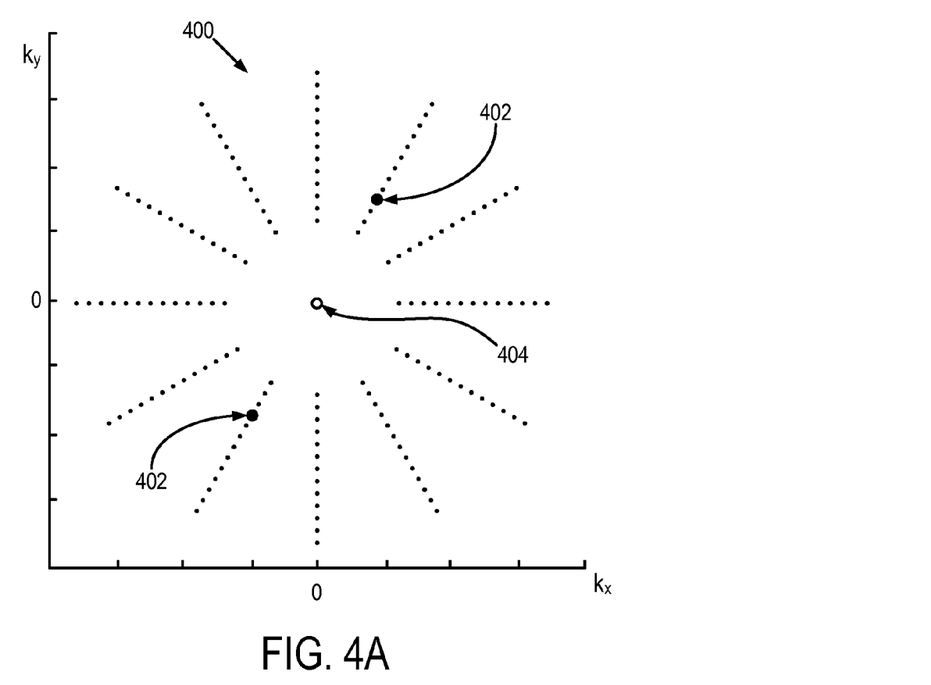
FIG. 4A is a graphic illustration of an exemplary k-space excitation pattern as seen in a $k_x$-$k_y$ plane.
Figure 4B:
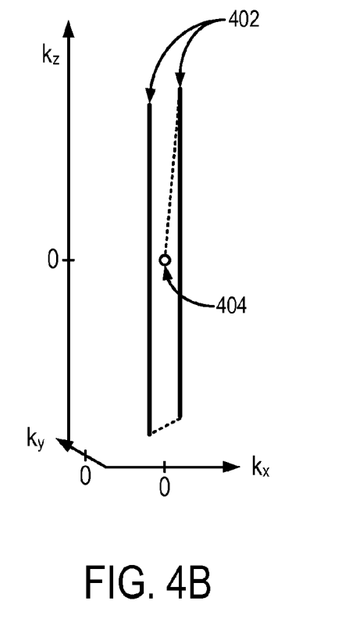
FIG. 4B is a graphic illustration of a pair of excitation k-space spokes that form a part of the exemplary k-space excitation pattern of FIG. 4A.
Figure 4C:
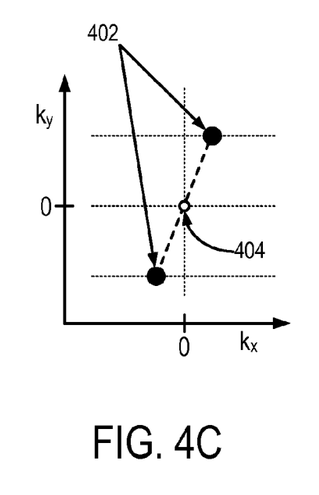
FIG. 4C is an in-plane view of a pair of excitation k-space spokes that form a part of the exemplary k-space excitation pattern of FIG. 4A.

In order to design a plurality of RF excitation waveforms, a desired k-space excitation pattern is first selected, as indicated at step 304. A k-space excitation pattern indicates the locations in k-space at which RF energy is to be deposited by the RF excitation pulses. An exemplary k-space excitation pattern is illustrated in FIGS. 4A-4C. This excitation pattern includes a series of paired k-space spokes 400 in the $k_z$ direction that are spaced by a fixed distance away from the center of k-space 404 and are further rotated about the center of k-space 404 within the $k_x$-$k_y$ plane by a specific amount, as shown in FIG. 4A. In this manner, each pair of k-space spokes 402 is symmetrically disposed about the center of k-space 404, as shown in FIGS. 4A-4C. While the present invention will be described with respect to the k-space excitation pattern shown in FIG. 4A, it will appreciated by those skilled in the art that any number of k-space excitation patterns may be employed when practicing the present invention. For example, k-space spokes along either the $k_x$ or $k_y$ axes, radial trajectories that span across two or three dimensions in excitation k-space, and a continuous spiral k-space trajectory may be employed.

In producing the exemplary k-space spokes shown in FIGS. 4A-4C, slice-selective RF pulses that include segments that resemble sine cardinal ("sinc") functions are utilized. When applied, for example, in the presence of magnetic field gradients applied along the z-axis of the MRI system, these sinc pulses result in the traversal of k-space "spokes" because, as each is played, its trajectory in k-space is a straight line. These pulses conform with a small-tip angle approximation, in which a Fourier relationship holds between the energy deposited by the RF pulse and the resulting transverse magnetization. Such a relationship gives rise to so-called "excitation k-space." In excitation k-space, a rectangle-like slice profile along a spatial z-axis is achieved by playing each spoke along the $k_z$ direction of excitation k-space. In practice, a true sinc function along $k_z$ is replaced by a finite-length waveform, such as a Hanning-windowed sinc. The time-bandwidth product of the pulse segment and its extent in $k_z$ influences the thickness and transition edges of the resulting thin-slice excitation.

An exemplary desired excitation, d(r), has phase that varies slowly enough across space such that intravoxel dephasing is not a concern. Slowly-varying phase is permissible for the majority of standard imaging scenarios since such studies are primarily concerned with image magnitude. As will be described below in detail, a magnitude least squares ("MLS") method is employed to produce the RF pulse waveforms that, when played out in the respective transmission channels of a coil array, achieve excitations substantially close to the desired excitation, d(r).

Referring again to FIG. 3, the RF excitation pulse waveforms associated with producing the desired excitation pattern, d(r), are determined next, as indicated at step 306. A magnitude least squares ("MLS") method is utilized to generate P RF pulse waveforms that excite a pattern substantially close to the desired excitation pattern, d(r). This desired pattern, d(r), is sampled with M samples to form an excitation pattern vector, d. In this case, because a substantially uniform excitation is desirable, every element of d is fixed to equal 0.1 radians; however, no phase is specified per element because a slowly-varying phase will be inherently determined by the MLS method.

Since the desired k-space excitation pattern, d(r), has been selected, the k-space trajectory, $k(t)=[k_x(t), k_y(t), k_z(t)]^T$, is fixed, along with the associated gradient waveforms, $G(t)=[G_x(t), G_y(t), G_z(t)]^T$. By assuming a small-tip angle excitation, a linear formalism is applied to arrive at the following linear relationship between the pulse waveforms transmitted through the multi-channel coil array and the resulting excitation:

$$m(r) = i\gamma M_0 \sum_{p=1}^{P} S_p(r) \int_0^L a_P(t)e^{ir\cdot k(t)}dt; \quad \text{Eqn. (6)}$$

where $M_0$ is the steady-state magnetization, $r=[x,y,z]^T$ is a spatial variable; t is a temporal variable; m(r) is an approximate complex-valued transverse magnetization resulting from the transmission of the RF pulse waveforms in the presence of the time-varying gradients; γ is a gyromagnetic ratio; $S_p(r)$ is a complex-valued $B_1^+$ transmit profile of the $p^{th}$ coil element in the coil array; $a_p(t)$ is an RF pulse waveform played out in the $p^{th}$ coil; L is the duration of each RF pulse waveform; and $$k(t) = -\gamma \int_t^L G(\tau)d\tau. \quad \text{Eqn. (7)}$$

The linear relationship in Eqn. (6) is discretized by sampling space at locations $r_1, \ldots, r_M$ within the FOX and sampling time at $t_1, \ldots, t_l \in [0,L]$; the $t_i$ are spaced uniformly by, for example, $\Delta_t$=10 μs. This discretization yields:

$$m = S_1 F a_1 + \ldots + S_P F a_P \quad \text{Eqn. (8);}$$

which can alternatively be expressed as:

$$m = [S_1 F \ldots S_P F] \cdot \begin{bmatrix} a_1 \\ \vdots \\ a_P \end{bmatrix} = A_{tot} a_{tot}; \quad \text{Eqn. (9)}$$

where $S_P$ is a diagonal matrix containing M samples of the $p^{th}$ spatial profile, $S_P(r)$, taken within a user-defined FOX. The matrix, F, relates energy placed in k-space into the spatial domain at the M locations where each coil profile is sampled. Formally:

$$F = i\gamma M_0 \Delta_t e^{ir_m \cdot k(t_n)} \quad \text{Eqn. (10).}$$

Finally, each of the RF pulse waveform vectors, $a_p$, include samples of the $p^{th}$ RF waveform, $a_p(t)$, having an temporal sample spacing, $\Delta_t$.

On a conceptual level, MLS solves the following optimization:

$$\min_{a_{tot}} \{\||d - |A_{tot} a_{tot}|\|_2^2 + \delta\|a_{tot}\|_2^2\}; \quad \text{Eqn. (11)}$$

where δ is a small non-negative value that penalizes pulse candidates with excessive $l_2$ pulse energies. Exemplary methods for designing a plurality of candidate RF pulse waveforms using MLS are described, for example, in co-pending U.S. patent application Ser. No. 12/544,714, entitled "Method for Producing Spectral-Spatial Parallel RR Excitation Pulses for Magnetic Resonance Imaging," which is herein incorporated by reference in its entirety. Attention should be drawn to the absolute value operator surrounding $A_{tot} a_{tot}$. This absolute value indicates that the resulting phase of the excitation is disregarded during the determination of the RF pulse waveforms. More specifically, MLS ensures that each two-spoke pulse waveform designed produces a substantially uniform excitation, even though the RF pulse waveforms of each design may at times vary in phase due to their spoke position differences in $k_x$-$k_y$ space. More particularly, Eqn. (11) seeks to find a set of pulse waveforms that produce an excitation whose magnitude at all spatial locations is substantially close to the desired magnitude.

In order to prevent rapidly-varying phase in the resulting excitation, m(r), and to avoid detrimental intravoxel dephasing, the MLS optimization is iterated a number of times, modifying the initial input to the optimization each time. This iterative process yields a solution, $a_{tot}$, whose pulse samples produce a high-fidelity version of the desired magnitude pattern. In particular, the MLS optimization is iteratively repeated until the phase variation in the determined RF pulse waveforms is satisfactory, for example, less than 8 degrees per millimeter.

The local SAR produced by each of the determined RF pulse waveforms in a selected portion of the subject is calculated next, as indicated at step 308. An exemplary method for calculating the local SAR for each pulse waveform includes calculating the average SAR produced by a given RF excitation pulse in an N-gram cube, $SAR_p^{Ng}(r)$ centered at a spatial location, r. Such a method is described below with respect to FIG. 5 in detail. After the local SAR for each RF waveform has been calculated, relative weightings for each candidate RF pulse waveform that substantially minimize the local SAR in the selected portion of the subject are calculated, as indicated at step 310.

An exemplary convex optimization method that determines how to time-multiplex a set of P candidate RF pulses such that the resulting maximum local N-gram SAR is minimized is now described. Note that P different pulses will not necessarily end up being played; instead, the same pulse may be applied more than once during a given time period. It is noted that each of the P candidate RF pulses, p, produces substantially the same excitation, but that not all of the pulses are exactly equal to the others. As a result, the candidate RF pulses will produce dissimilar SAR profiles across space, due to the fact that the resulting SAR spatial pattern is more sensitive than the resulting excitation pattern to slight changes in RF pulse amplitudes and phases. For example, the differing magnitudes and phases of the candidate RF pulses impact the superposition of electric fields over time and, thus, the spatial SAR distribution. Because of this, the spatial distribution of SAR across space due to a given pulse, p, will not exactly equal the spatial distribution of SAR across space due to the other candidate pulses; thus, the P candidate pulses are multiplexed to reduce maximum local SAR.

To achieve this, P relative weights, $w_p$, are calculated such that the weights sum to unity and such that each weight is non-negative. These requirements ensure that a physically realizable timing schedule is produced. Each weight, $w_p$, indicates the proportion of time, that is, proportion of the repetition time ("TR"), to play the corresponding $p^{th}$ pulse. By way of example, if the weights are determined such that $w_A$=0.837, $w_B$=0.163, and all other weights, $w_j$, equal zero, then the optimal multiplexing scheme involves playing pulse A 83.7 percent of the time and pulse B 16.3 percent of the time during a given repetition time period ("TR"). Since the number of TRs employed to conduct an imaging task is always finite, these weights are rounded off to obtain a substantially optimal solution. For example, if 100 TRs are necessary, one would play pulse A eighty-four times and pulse B sixteen times. Generally speaking, it is up to the user to choose the exact order in which to play the pulses since the ordering does not significantly affect the maximum local SAR produced. However, through a judicious selection of how to temporally order the applications of the selected candidate RF pulses, other benefits can be achieved, such as a management of short-term local SAR constraints and reduction in second order effects.

By way of example, during the $p^{th}$ TR period, pulse p, whose duration equals $L_p$, is played from time $(p-1) \cdot TR$ through $(p-1) \cdot TR + L_p$, and no RF pulses are transmitted during the time interval beginning at $(p-1) \cdot TR + L_p$ and ending at $p \cdot TR$. That is, the $p^{th}$ candidate pulse is played for a fraction, $w_p$, of the total number of TRs, while imposing the constraint that $$\sum_{p=1}^{P} w_p = 1.$$

Under such a multiplexing scheme, the total local SAR in an N-gram cube accumulated during the application of the P candidate RF pulses is given by:

$$SAR^{Ng}(r) = \sum_{p=1}^{P} w_p \cdot SAR_p^{Ng}(r). \qquad \text{Eqn. (12)}$$

Having derived the local N-gram SAR that arises at a single location, r, a linear-algebraic method for computing the local N-gram SAR at all M spatial locations in a subject that arises due to the multiplexing scheme of the P pulses represented by the weights, $w_p$, is given by:

$$s_{overall}^{Ng} = Sw \qquad \text{Eqn. (13);}$$

where, $$S = [s_1, \ldots, s_P] \qquad \text{Eqn. (14);}$$

with:

$$s_p = [SAR_p^{Ng}(r_1), \ldots, SAR_p^{Ng}(r_M)]^T \qquad \text{Eqn. (15);}$$

and $$w = [w_1, \ldots, w_P]^T \qquad \text{Eqn. (16).}$$

Given the P candidate pulses, the weights, $w_p$, that best minimize the maximum local N-gram SAR that arises when applying the RF pulses over many TRs is determined, for example, by the following minimization:

$$\min_{w} \|Sw\|_{\infty}; \qquad \text{Eqn. (17)}$$

such that, $$w_p \in [0,1] \text{ for } p \in 1, \ldots, P, \text{ and:}$$

$$\sum_{p=1}^{P} w_p = 1. \qquad \text{Eqn. (18)}$$

This is a convex optimization and, thus, by solving it the set of weights, w, that best minimizes the overall local N-gram SAR is determined.

The individual weights, $w_p$, are extracted from the determined set of weights, w, and are employed to create an RF pulse timing schedule that best minimizes local N-gram SAR, as indicated at step 312. This timing schedule and the determined RF pulse waveforms are then stored, for example, on the pulse sequence server 118 of the MRI system, such that a user can readily utilize the timing schedule and determined RF pulse waveforms when directing the MRI system with an appropriate pulse sequence. A pulse sequence designed using the timing schedule and RF pulse waveforms will minimize the local SAR in a selected portion of the subject of an examination, thereby allowing for the benefits of using a parallel transmission RF coil array without the drawbacks of exposing a subject to the risks of increased local SAR.

Figure 5:
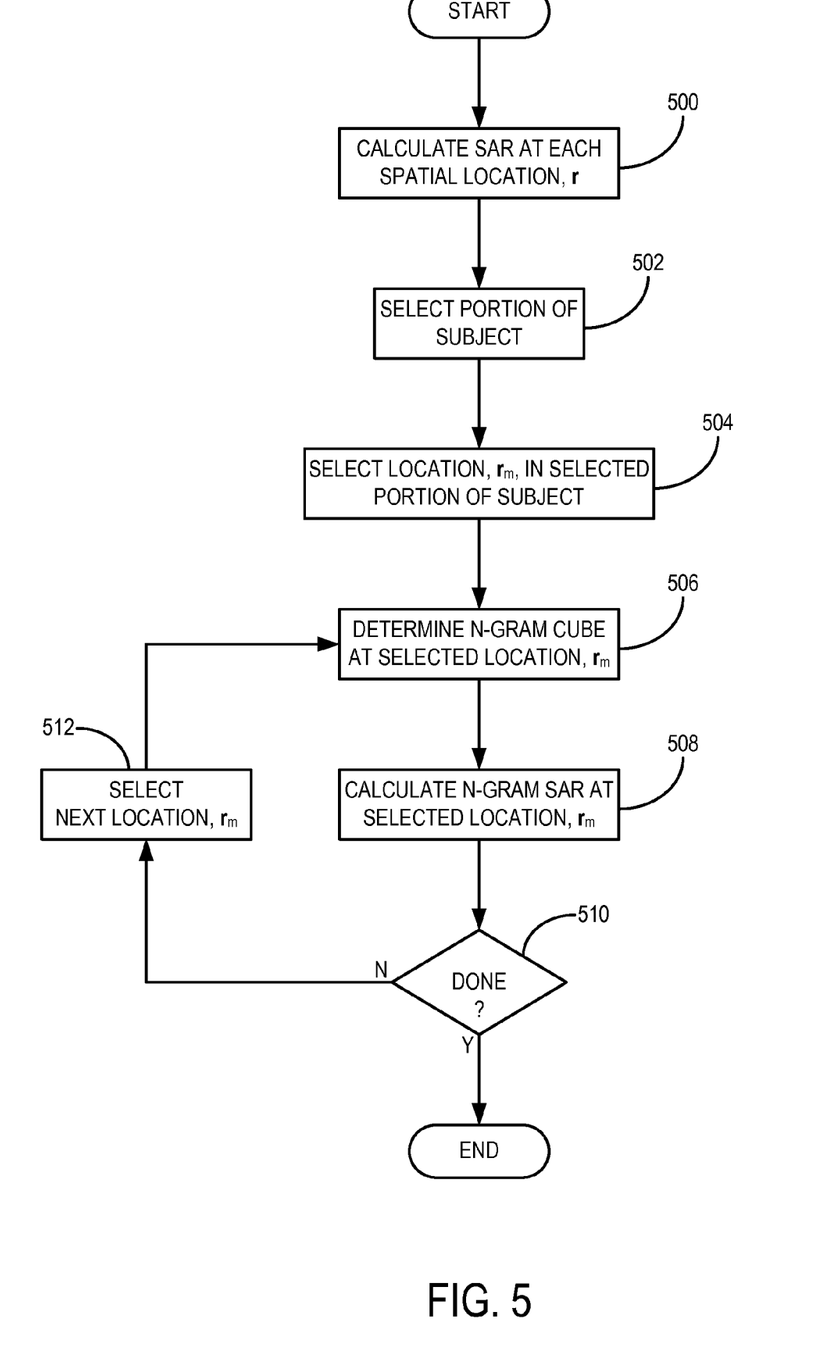
FIG. 5 is a flowchart setting forth the steps of an exemplary method for determining an N-gram SAR.

Referring now to FIG. 5, a flowchart setting forth the steps of an exemplary method for calculating SAR in an N-gram cube is illustrated. This method begins with the calculation of SAR at each spatial location, r, within a given FOX, as indicated at step 500. The value of SAR at the voxel location r is calculated, for example, by superimposing the electric field produced by each transmit channel due to each time sample in the given RF excitation pulse and then time averaging the square of the net field over the plurality of RF pulse waveforms repetition time ("TR") interval, in which the pulses are played, and weighting the average by the conductivity and density at that location. Formally, the SAR at a spatial location, r, that is produced by applying the $p^{th}$ RF excitation pulse is given by:

$$SAR(r) = \frac{\sigma(r)}{2\rho(r)} \frac{1}{p \cdot TR} \int_0^{p \cdot TR} \|E(r,t)\|_2^2 dt; \qquad \text{Eqn. (19)}$$

where $\sigma(r)$ is the conductivity at the spatial location, r; $\rho(r)$ is the density at the spatial location, r; and E(r,t) is the superposition of the electric fields generated by each of the channels scaled by the waveform samples transmitted at each time instant. More specifically, $$E(r,t) = \sum_{p=1}^{P} a_p(t) E_p(r). \qquad \text{Eqn. (20)}$$

Each $E_p(r)$ is the 3D electric field obtained, for example, via the finite difference time domain simulation described above, that arises when the $p^{th}$ channel is driven by a unit ampere waveform. The quantities $\sigma(r)$ and $\rho(r)$ are either given by a model, or can alternatively be calculated for the given subject. In the latter situation, an image of the subject is utilized to identify the anatomical structures located within the selected FOX.

Next, a portion of the subject, in which it is desired to minimize the local SAR, is selected, as indicated at step 502. For example, a previously acquired image of the subject is utilized to identify a particular portion of the subject containing anatomical structures, such as organs including the brain, liver, heart, and lungs, in which it is desired to minimize the maximum local SAR occurring in the specified region. A spatial location, $r_m$, located within the selected portion of the subject is then selected, as indicated at step 504. An N-gram cube is then determined for this spatial location, as indicated at step 506. this is achieved using a fast region-growth method rather than a brute-force region growth method, since the latter is computationally infeasible. By way of example, a list of spatial positions from a simple cubic lattice is formed in order of distance from the origin of a spatial coordinate system. Such a list is interpreted as a "universal" list of offsets from any given spatial location, r. The set of voxels that includes N-grams of tissue around the selected location, $r_m$, is found by choosing the shortest prefix of this list that yields sufficient total mass. Formally, given the mass per voxel around the spatial location, $\rho(r_m)$, and this universal list, a voxel mass vector is formed and the cumulative sum of this voxel mass vector is searched for the number of voxels needed to form the set. This method rapidly determines the cluster of points that include an N-gram cube around $r_m$. These rapidly-determined points are viewed as a set of indices, $I_N^r$, such that, $$\sum_{i \in I_N^r} \rho(r_m) \approx N \text{ grams.} \qquad \text{Eqn. (21)}$$

The N-gram SAR at the selected location, $r_m$, in the selected portion of the subject is subsequently calculated, as indicated at step 508. To calculate the SAR in an N-gram cube, all of the calculated SAR values, SAR(r), included in the N-gram cube are averaged. Thus, having determined the N-gram cube centered at the selected spatial location, $r_m$, the N-gram SAR is subsequently calculated as:

$$SAR^{Ng}(r_m) = \frac{1}{|I_N^r|} \sum_{i \in I_N^r} SAR(r_i); \qquad \text{Eqn. (22)}$$

where $|I_N^r|$ is the cardinality, that is, the number of elements, in $I_N^r$.

Note that for a spatial location on the edge of the subject bordering air (where $\sigma_{air}=0$), the associated location, $r_m$, may not be at the center of the corresponding N-gram averaging cube, but this is mitigated by the fact that this location, $r_m$, is often part of the averaging cubes of many adjacent spatial locations.

It will be appreciated by those skilled in the art that the present invention can alternatively be practiced by averaging SAR(r) values over other geometric regions, such as a sphere. However, the Food and Drug Administration and the International Electrotechnical Commission mandate averaging over cubes instead of spheres (see, for example, Center for Devices and Radiologic Health "Guidance for the Submission of Premarket Notifications for Magnetic Resonance Diagnostic Devices," *Rockville, Md.: Food and Drug Administration;* 1998, and International Electrotechnical Commission, "International Standard, Medical Equipment-Part 2: Particular Requirements for the Safety of Magnetic Resonance Equipment for Medical Diagnosis, 2nd Revision," *Geneva: International Electrotechnical Commission;* 2002).

A determination is subsequently made as to whether the N-gram SAR for each spatial locations, r, in the selected portion of the subject has been calculated, as decided at decision block 510. If not, the next voxel location, r, is selected at step 512 and the aforementioned process is repeated.

Thus, a method for substantially optimally minimizing the maximum local SAR produced in a particular spatial volume-of-interest in a subject has been provided. More specifically, the provided method achieves this significant reduction in maximum local SAR by determining from a plurality of candidate RF pulses having similar RF excitation profiles, but differing SAR profiles, which pulses are to be applied and how many times each identified pulse is to be applied during a series of TR periods. This so-called "timing schedule" includes a plurality of weighting factors that define the percentage of time during a series of TR periods that a particular candidate RF pulse is to be applied. However, the timing schedule may also define the specific temporal order in which the particular RF pulses are applied during the series of TR periods. Even though a particular identified pulse may not produce a globally minimal local SAR, the overall effect of applying the plurality of pulses in the manner specified by the determined timing schedule results in an optimally minimized maximum local SAR.

The present invention has been described in terms of one or more preferred embodiments, and it should be appreciated that many equivalents, alternatives, variations, and modifications, aside from those expressly stated, are possible and within the scope of the invention. For example, further SAR-reduced parallel transmission pulse design methods can be incorporated into the method of the present invention. Also, as noted above, time multiplexing schemes can also be determined using radial and spiral-trajectory based RF excitation pulses, as well as in single-channel systems.

The invention claimed is:

1. A method for producing a radio frequency excitation field with an RF coil that forms a part of an MRI system, the steps comprising:
    a) estimating an electric and a magnetic field produced by the RF coil;
    b) estimating an RF transmission profile of the RF coil using the estimated magnetic field;
    c) selecting locations in k-space to which RF energy is to be deposited;
    d) determining, using the estimated RF transmission profile and selected locations in k-space, a plurality of candidate RF pulse waveforms corresponding to a plurality of candidate RF pulses that have substantially similar excitation profiles but different specific absorption ratio (SAR) profiles;
    e) calculating a local SAR value at each spatial location within a selected portion of the subject for each candidate RF pulse waveform;
    f) calculating a plurality of weighting factors, using the determined plurality of candidate RF pulse waveforms and calculated local SAR values for each candidate RF pulse waveform, the plurality of weighting factors defining a number of times to apply RF pulses corresponding to selected ones of the plurality of candidate RF pulse waveforms in order to substantially minimize maximum local SAR in the selected portion of the subject; and
    g) directing the MRI system, using the calculated plurality of weighting factors and the associated selected ones of the plurality of candidate RF pulse waveforms, to produce a plurality of RF excitation pulses during a selected time period in order to produce an RF excitation field.

2. The method as recited in claim 1 in which the RF excitation field produced in step g) has a maximum local SAR that is lower than the maximum local SAR produced by applying any one of the plurality of RF excitation pulses alone over the selected time period.

3. The method as recited in claim 1 in which step e) includes calculating an SAR value at each spatial location in a field-of-excitation that contains the subject using the estimated electric field.

4. The method as recited in claim 3 in which step e) includes identifying a cubical region of space that contains substantially N-grams of mass associated with the subject for each spatial location in the selected portion of the subject.

5. The method as recited in claim 4 in which step e) includes calculating an N-gram SAR at each spatial location in the selected portion of the subject using the calculated SAR value and identified cubical region of space corresponding to the associated spatial location.

6. The method as recited in claim 5 in which the N-gram SAR is calculated in step e) by averaging the calculated SAR values for each spatial location in the identified cubical region of space.

7. The method as recited in claim 1 in which step f) includes forming an objective function that relates a maximum local SAR in the selected portion of the subject to the calculated local SAR for each candidate RF pulse waveform and the plurality of weighting factors.

8. The method as recited in claim 7 in which step f) includes minimizing the formed objective function such that the maximum local SAR in the selected portion of the subject is substantially minimized.

9. The method as recited in claim 1 in which the RF coil is an RF coil array that includes a plurality of RF transmission channels.

10. The method as recited in claim 9 in which step a) includes estimating an electric and a magnetic field produced by each of the plurality of RF transmission channels in the RF coil array.

11. The method as recited in claim 10 in which step b) includes estimating an RF transmission profile for each of the plurality of RF transmission channels in the RF coil array using the associated estimated magnetic field.

12. The method as recited in claim 10 in which step e) includes calculating an SAR value at each spatial location in a field-of-excitation that contains the subject using the estimated electric field produced by each of the plurality of RF transmission channels in the RF coil array.

13. The method as recited in claim 12 in which step e) includes:
   i) identifying a cubical region of space that contains substantially N-grams of mass associated with the subject for each spatial location in the selected portion of the subject; and
   ii) calculating an N-gram SAR at each spatial location in the selected portion of the subject by averaging the calculated SAR values for each spatial location in the identified cubical region of space.

14. The method as recited in claim 1 in which step g) includes producing a timing schedule that defines the timing and order in which each of the selected ones of the plurality of candidate RF pulse waveforms are to be used by the MRI system to produce an RF excitation pulse.

15. The method as recited in claim 1 in which step c) includes forming an objective function using the selected locations in k-space and the estimated RF transmission profile.

16. The method as recited in claim 15 in which step c) includes minimizing the formed objective function using a magnitude least squares estimation.

17. The method as recited in claim 15 in which the objective function in step c) includes a term that penalizes candidate RF pulse waveforms that have an $l_2$ energy above a selected threshold.

* * * * *